United States Patent [19]
Hébert et al.

[11] Patent Number: 5,869,381
[45] Date of Patent: Feb. 9, 1999

[54] RF POWER TRANSISTOR HAVING IMPROVED STABILITY AND GAIN

[75] Inventors: Francois Hébert; William McCalpin, both of Sunnyvale, Calif.

[73] Assignee: Spectrian, Inc., Sunnyvale, Calif.

[21] Appl. No.: 939,186

[22] Filed: Sep. 29, 1997

Related U.S. Application Data

[62] Division of Ser. No. 756,297, Nov. 25, 1996, Pat. No. 5,821,602.

[51] Int. Cl.$^6$ .................................................. H01L 21/328
[52] U.S. Cl. .......................... 438/330; 438/330; 438/309; 438/324; 438/329; 438/338; 438/342
[58] Field of Search ..................................... 438/309, 329, 438/338, 342, 330, 324, 326

[56] References Cited

U.S. PATENT DOCUMENTS

| | | | |
|---|---|---|---|
| 5,374,844 | 12/1994 | Moyer ..................................... | 257/582 |
| 5,455,449 | 10/1995 | Inn ......................................... | 257/578 |
| 5,488,252 | 1/1996 | Johansson et al. ..................... | 257/579 |
| 5,567,964 | 10/1996 | Kashihara et al. ..................... | 257/310 |
| 5,629,648 | 5/1997 | Pratt ....................................... | 330/289 |
| 5,716,506 | 2/1998 | Maclay et al. .......................... | 204/424 |

FOREIGN PATENT DOCUMENTS

| | | | |
|---|---|---|---|
| 46-23206 | 7/1971 | Japan ..................................... | 257/581 |

OTHER PUBLICATIONS

Wolf Stanley, Silicon Processing for the VLSI Era, vol. 1, p. 520, 1990.

Primary Examiner—Charles Bowers
Assistant Examiner—Thanh Nguyen
Attorney, Agent, or Firm—Townsend and Townsend and Crew LLP; Henry K. Woodward

[57] ABSTRACT

Increased gain and improved stability are realized in using resistive emitter ballasting by including integrated capacitive elements in parallel with the resistive elements in the emitter circuit. A feature of the invention is an integrated capacitor structure having a small surface area to minimize parasitic capacitance, whereby resistor and capacitor surface areas of 100 square micrometers or less are obtained. Another feature of the invention is the use of a high dielectric material in realizing a resistor-capacitor impedance zero at a frequency much lower than the operating frequency of the transistor. For an operating frequency of 2 GHz and resistor values of 50–250 ohms, capacitance required is 3 pF or greater. Another feature of the invention is a method of fabricating the integrated resistive-capacitive element in either a low temperature process or a high temperature process which minimizes capacitor leakage when using a thin high dielectric insulative material between capacitor plates.

6 Claims, 7 Drawing Sheets

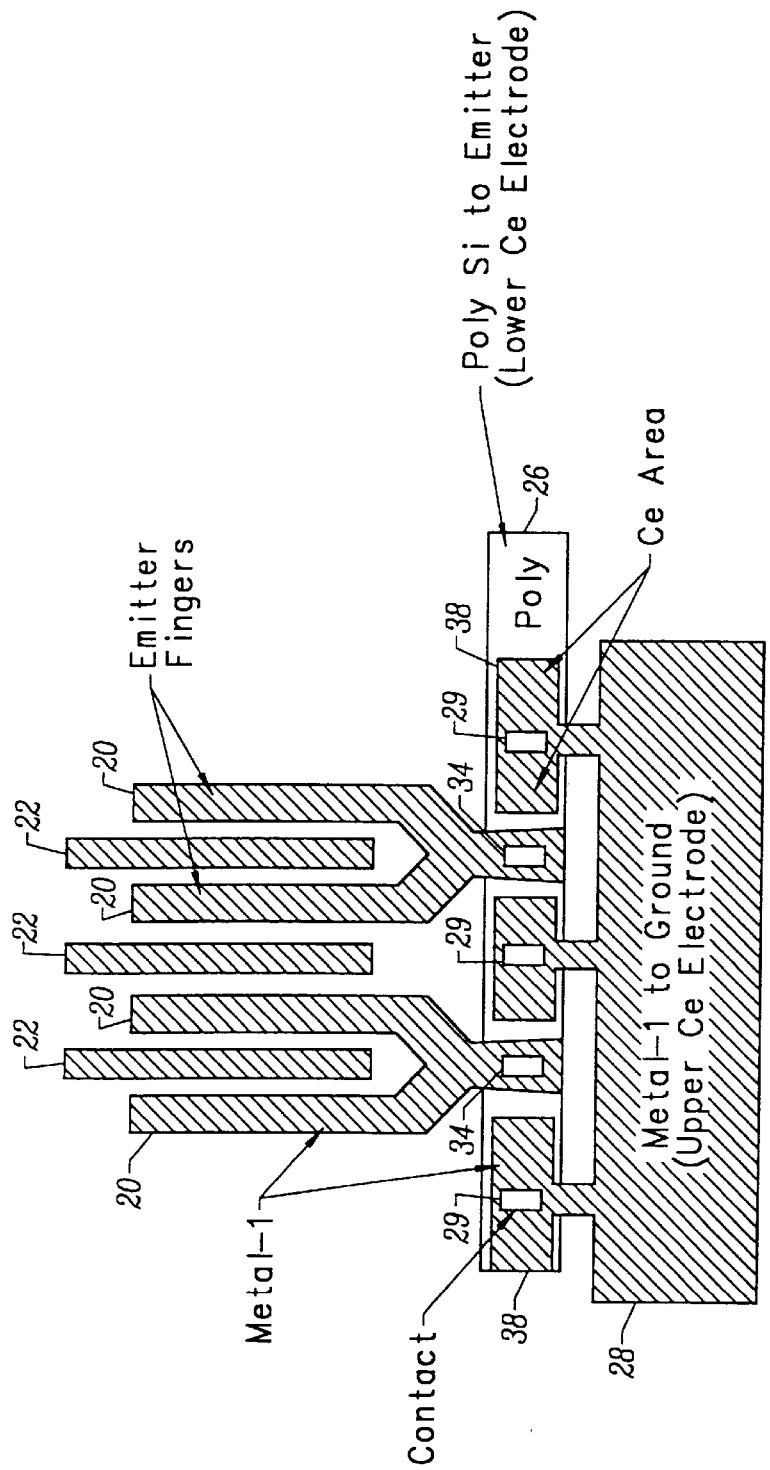
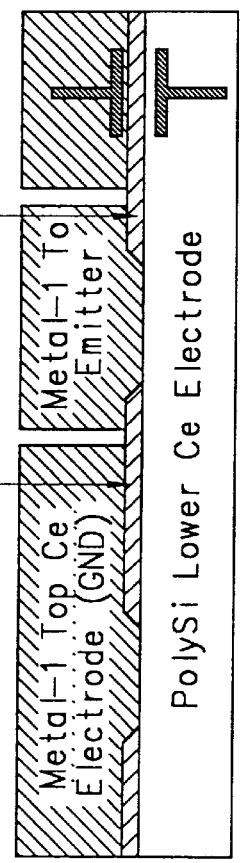
FIG. 4A
FIG. 4B

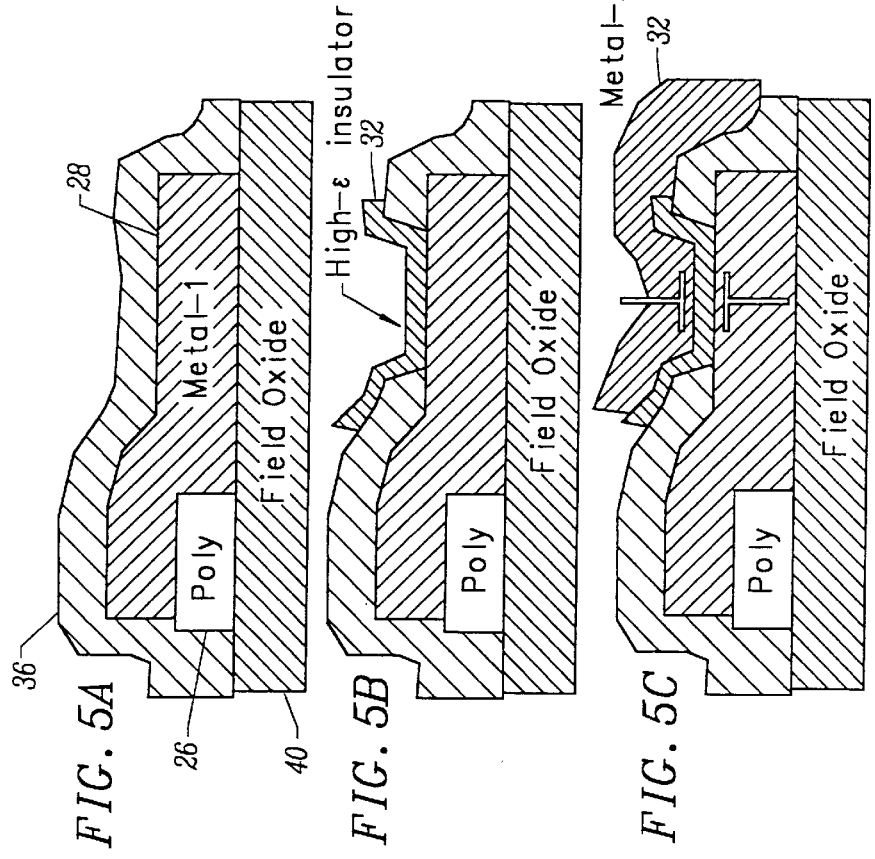

- Form active devices and resistor
- Define contact and capacitor areas over resistor by etching insulator on top of resistor (oxide or oxide/nitride)
- Deposit high-ε dielectric film (temperature only limited by stability of resistor), in-situ etch of native oxide
- Anneal of film (500–700C, 1min)
- Pattern and etch high-ε from contact areas
- Deposit metal interconnect
- Pattern metal interconnect
- Final passivation/anneal/alloy

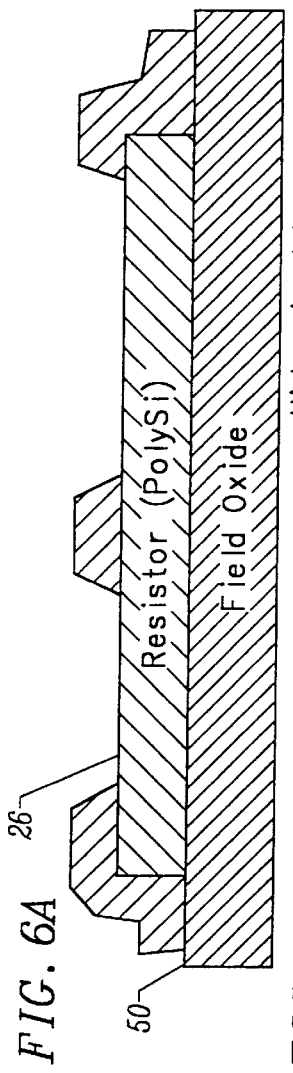

FIG. 6A

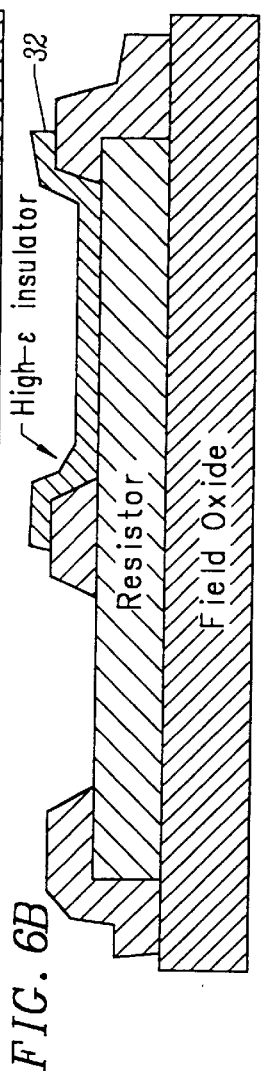

FIG. 6B

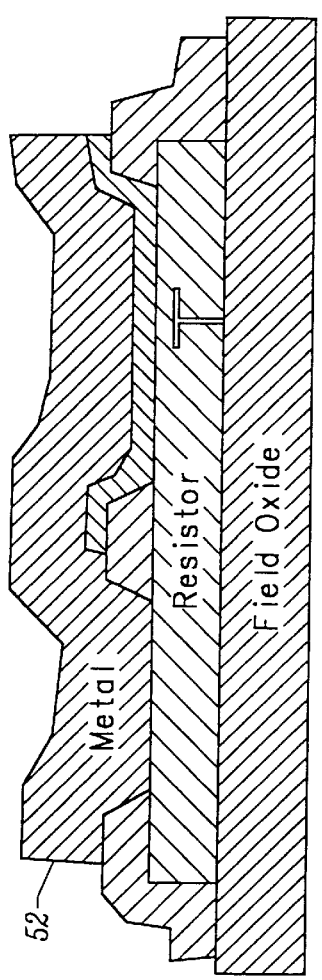

FIG. 6C

- Form active devices and resistor

- Etch passivation from top of resistor

- Deposit high-ε dielectric film (temperature only limited by stability of resistor), in-situ etch of native oxide

- Anneal (500–700C, 1min)

- Pattern and etch high-ε from contact areas

- Deposit metal interconnect

- Pattern metal interconnect

- Final passivation/anneal/alloy

RF POWER TRANSISTOR HAVING IMPROVED STABILITY AND GAIN

This is a Division of application Ser. No. 08/756,297 filed Nov. 25, 1996 U.S. Pat. No. 5,821,602 the disclosure of which is incorporated by reference.

BACKGROUND OF THE INVENTION

This invention relates generally to high frequency RF/microwave bipolar power transistors and, more particularly, the invention relates to such a transistor having improved stability and gain and methods of fabricating the transistor.

Resistive emitter ballasting is typically used on large RF power bipolar transistors to avoid thermal runaway and to reduce the impact of processing nonuniformities on device characteristics. Unfortunately, the serial resistor in the emitter circuit results in reduced gain. Further, emitter ballast nonuniformities can result in RF performance variations.

SUMMARY OF THE INVENTION

In accordance with the invention, increased gain and improved stability are realized in using resistive emitter ballasting by including integrated capacitive elements in parallel with the resistive elements in the emitter circuit.

A feature of the invention is an integrated capacitor structure having a small surface area to minimize parasitic capacitance, whereby resistor and capacitor surface areas of 100 square micrometers or less are obtained.

Another feature of the invention is the use of a high dielectric material in realizing a resistor-capacitor impedance zero at a frequency much lower than the operating frequency of the transistor. For an operating frequency of 2 GHz and resistor values of 50–250 ohms, capacitance required is 3 pF or greater.

Another feature of the invention is a method of fabricating the integrated resistive-capacitive element in either a low temperature process or a high temperature process which minimizes capacitor leakage when using a thin high dielectric insulative material between capacitor plates. Further, the different temperature processes permit the use of different material for the lower capacitor electrode, including aluminum for the low temperature process and polysilicon/silicides for the high temperature process.

The invention and objects and features thereof will be more readily apparent from the following detailed description and appended claims when taken with the drawings.

BRIEF DESCRIPTION OF THE DRAWINGS

FIGS. 4A, 4B are a plan view and a side view in section of a ballasted power transistor in accordance with yet another embodiment of the present invention.

FIGS. 5A–5C illustrate steps in a low temperature process flow for fabricating the ballast in accordance with the invention.

FIGS. 6A–6C illustrate steps in a high temperature process flow for fabricating the ballast in accordance with another embodiment of the invention.

DETAILED DESCRIPTION OF THE PREFERRED EMBODIMENT

Figure 1A:
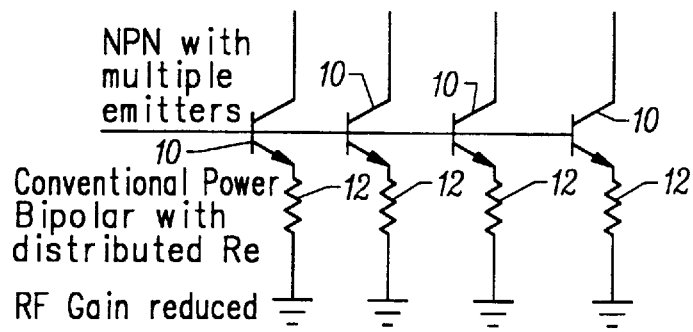
FIGS. 1A, 1B are schematics of RF bipolar power transistors with resistive emitter ballasting in accordance with the prior art and the invention, respectively.

Referring now to the drawings, FIG. 1A illustrates a plurality of RF power NPN bipolar transistors 10 with a resistor ballast ($R_e$) 12 connecting the emitters to ground. As noted above, use of resistive emitter ballasting avoids thermal runaway during operation of the transistors and reduces impact of processing nonuniformities on transistor characteristics. However, the resistive emitter ballasting results in reduced gain of the transistor and nonuniformities in the emitter ballasting can result in RF performance variations.

Figure 1B:
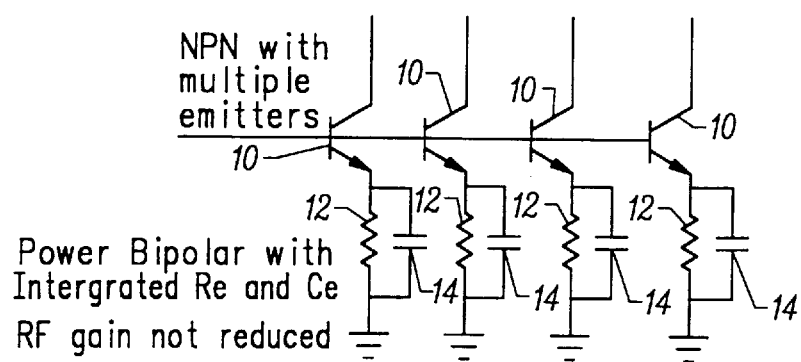

FIG. 1B illustrates the transistors 10 with integrated resistive-capacitive ballasting in accordance with the invention. Each of the emitter resistors 12 has a capacitor 14 integrated in parallel therewith so that the RF performance of the transistors is not adversely affected by the resistive ballasting.

An important requirement of the integrated resistorcapacitor ballast is a small surface area. However, for typical resistor values in the range of 50 to 250 ohms, the capacitor must be equal to or greater than 3 pF for 2 GHz applications. Typical insulator materials used for the fabrication of integrated capacitors have a low dielectric constant, thereby increasing the capacitor area. For example, silicon oxide has a dielectric constant of 3.9, silicon nitride ($Si_3N_4$) has a dielectric constant of 7.5, and silicon has a dielectric constant of 11.8. Thus, with the dielectric thickness on the order of 1,000Å, the surface area of a capacitor would be much greater than 30,000 $\mu m^2$.

In accordance with a feature of the invention, a high dielectric constant material, such as BST ($BaSrTiO_3$, BST), $Pb(ZR_{1-x}Ti)O_3$, $SrTiO_3$ and $Ta_2O_5$ provides a dielectric constant greater than 100. Using these dielectric materials, and an insulator thickness greater than 200 Å to minimize capacitor leakage, each capacitor has dimensions similar to the resistor (10×10 $\mu m^2$).

Figure 2A:
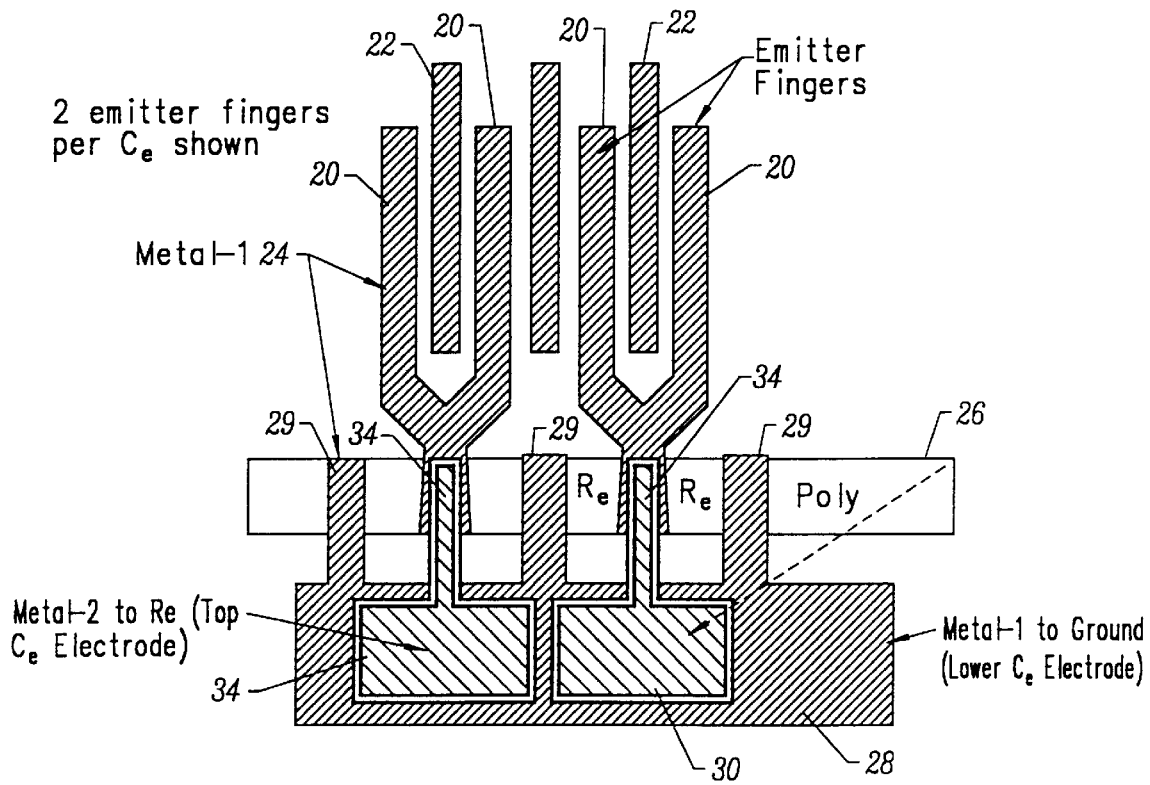
FIGS. 2A, 2B are a plan view and a side view in section of a ballasted bipolar transistor in accordance with one embodiment of the invention.
Figure 2B:
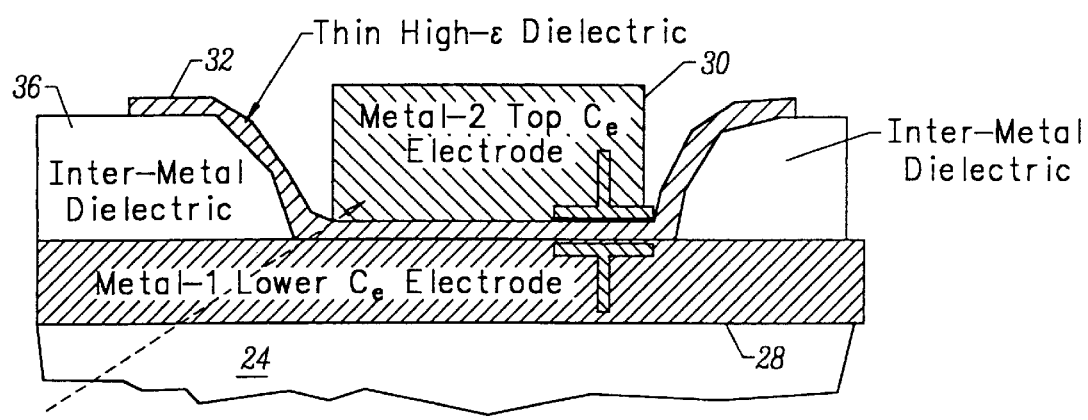

FIGS. 2A, 2B are a plan view and a side view section of a ballasted bipolar transistor in accordance with one embodiment of the invention. The transistor includes a plurality of emitter contacts 20 interdigitated with base contacts 22 on a surface of semiconductor body 24 in which the transistor is fabricated. A doped polycrystalline silicon layer 26 is formed on the surface and functions as the ballast resistors for the emitter contacts. A first metal layer 28 is formed on a silicon oxide layer on the surface and contacts the polysilicon layer 26 with extensions 29. A second metal layer 30 overlies the first metal layer 28 and is spaced therefrom by a dielectric 32 (FIG. 2B) to form a capacitive structure with the underlying first metal layer. The second metal layer contacts the polysilicon layer 26 and the emitter interconnects at emitter contacts 34. Thus the emitter resistor ($R_e$) comprises the regions of the polysilicon layer 26 between the emitter contacts 34 and the contacts 29. The dielectric 32 rests on a field oxide 36 or other inter-metal dielectric 36 away from the metal plates 30. The top metal layer 30 of the capacitor can be separate plates as shown or the plates can be one integral plate and form a distributed capacitance.

Figure 3A:
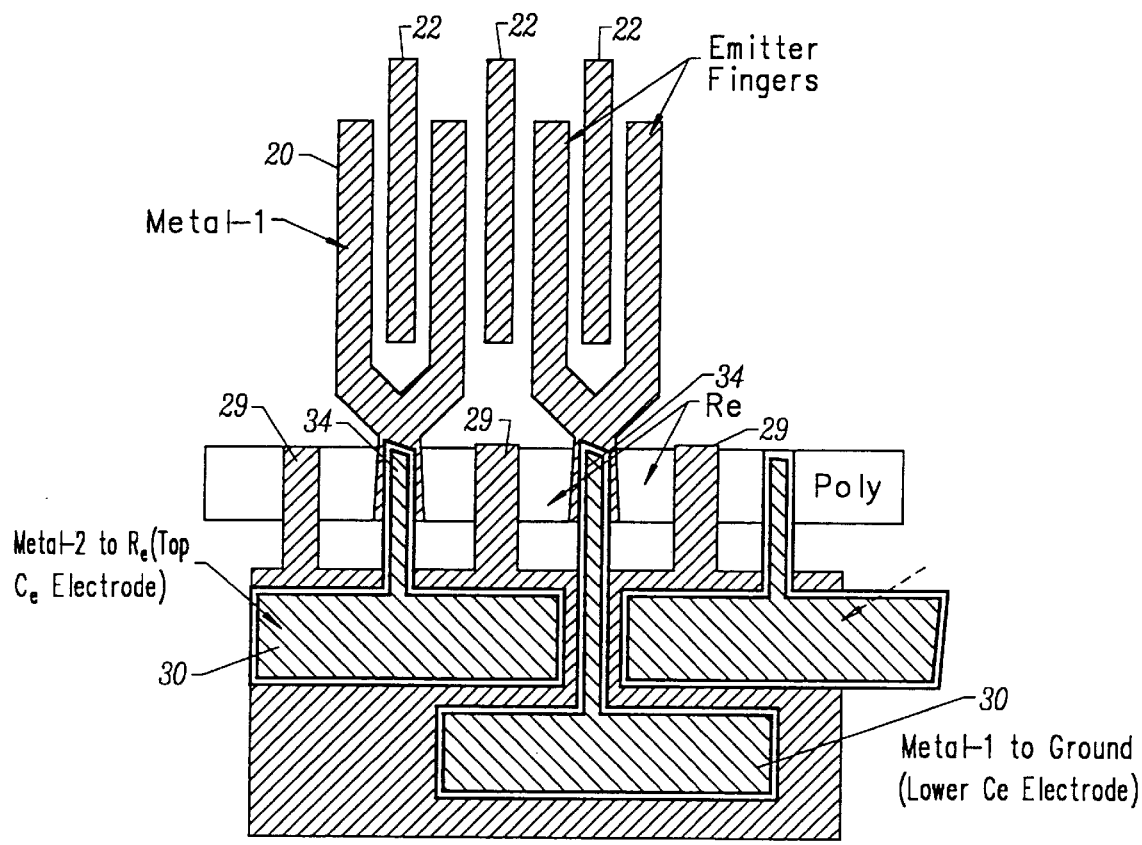
FIGS. 3A, 3B are a plan view and a side view in section of a ballasted bipolar power transistor in accordance with another embodiment of the invention.
Figure 3B:
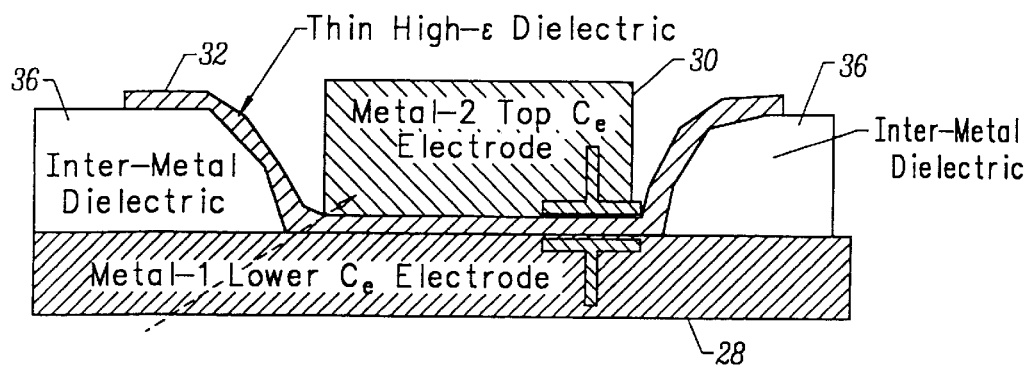

FIGS. 3A, 3B are a top view and a side view in section similar to the transistor layout of FIGS. 2A, 2B and like elements have the same reference numerals. However, in this embodiment, greater capacitive values are realized by offsetting the metal plates 30 overlying a larger metal capacitive plate 28.

FIGS. 4A, 4B are a top view and a side view in section respectively, similar to the embodiments of FIGS. 2 and 3, and again like elements have the same reference numerals. However, in this embodiment, the metal layer 28 includes tabs 38 which form the capacitive structure with the underlying polysilicon layer 26. The layer 28 spaced from the tabs 38 functions as a ground connection. Again, the emitter fingers 20 contact the polysilicon layer 26 at points 34 with the polysilicon layer functioning as the resistors 12 and the bottom plate of the capacitors 14. The metal 1 layer 28 and tabs 38 contact the polysilicon layer 26 at points 29.

Computer simulations performed to quantify the performance improvements using the structures of FIGS. 2–4, comparing a standard device with and the integrated capacitors have shown a greater than 1.0 db gain improvement using the ballast capacitor, and a greater than 4 dB linearity improvement with the ballast capacitor.

In realizing these improvements, an insulator with a high dielectric constant is required between the capacitor plates, and careful control of the interfaces between the high dielectric insulator and the electrodes of the capacitor is required. Two methods of fabrication have been employed in fabricating the ballast structure in accordance with the invention, including a high temperature flow using a high dielectric insulator on top of an electrode compatible with high temperature processing (greater than 500° C.), and a low temperature flow in which the high dielectric constant insulator is formed on top of an electrode compatible with low temperature processing (less than 500° C.). High dielectric constant materials which have been employed include barium strontium titanate (BaSrTiO$_3$, "BST"), lead zirconium titanate Pb(Zr$_{1-x}$Ti)O$_3$, strontium titanate (SrTiO$_3$) and tantalum oxide (Ta$_2$O$_5$). Deposition techniques employed include low pressure chemical vapor deposition and metal organic chemical vapor deposition and plasma vapor deposition (PVD) sputtering.

Interface control is a major consideration in forming the insulator over the bottom capacitor contact. The presence of any native oxides (for example BST deposited on top of polysilicon having a native oxide) reduces effective dielectric constant. Therefore, the capacitive plate surface of the underlying electrode is cleaned by in situ etching of any native oxide on the electrode immediately prior to deposition of the high dielectric insulator, such as in situ sputtering or plasma etch and hydrogen passivation of the cleaned surface. Also, a native oxide free material, such as platinum, platinum silicide and gold, can be formed on the capacitor plate surface prior to depositing the high dielectric insulator.

FIGS. 5A–5C are side views in section illustrating low temperature steps in fabricating the ballast structure in the embodiments of FIGS. 2 and 3. FIG. 5A shows the polysilicon resistor layer 26 on top of a field oxide 40 with the first metal layer 28 contacting the polysilicon layer 26. An inter-metal dielectric 36 is deposited over the metal layer 28 (gold, TiW/Au/Pt).

As shown in FIG. 5B, the inter-metal dielectric layer 36 is patterned and contacts in capacitor areas are exposed on the metal layer 28. The high dielectric material 32 is then deposited on the exposed metal layer to a thickness of 400–1,500 Å. Annealing of the dielectric layer is optional after deposition and typically is cured at 450°–550° C. for one minute. Dielectric layer 32 is patterned and etched using plasma or ion beam, for example, and then the second metal layer 32 (Al or Al alloy) is deposited and pattern etched as shown in FIG. 5C. Other material including refractory metals and alloys can be used for the second material. A final passivation, anneal, and alloying steps can then be carried out.

FIGS. 6A–6C and FIGS. 7A–7C illustrate two high temperature process flows which can be used for any of the embodiments of FIGS. 2, 3 and 4. The high temperature process flows are similar to the flow diagram of FIGS. 5A–5C. However, for the embodiment of FIG. 4, the process steps illustrated in FIGS. 6A–6C and FIGS. 7A–7C are employed. In FIG. 6A, the polysilicon resistor 26 is shown formed over a field oxide 50. Contact and capacitor areas are defined over the resistor by etching an insulator on top of the resistor (oxide or oxide/nitride) and thereafter a high dielectric constant insulator is deposited over the capacitor area after in situ etch of native oxides from the surface of the capacitor area. The film can be annealed at 500°–700° C. for one minute and thereafter pattern etched from the contact area, as shown in FIG. 6B. Thereafter, as shown in FIG. 6C, the aluminum metal interconnect 52 and capacitor plate are deposited and patterned. A final passivation layer can then be formed over the capacitor structure and annealed and alloyed as required.

Figure 7A:
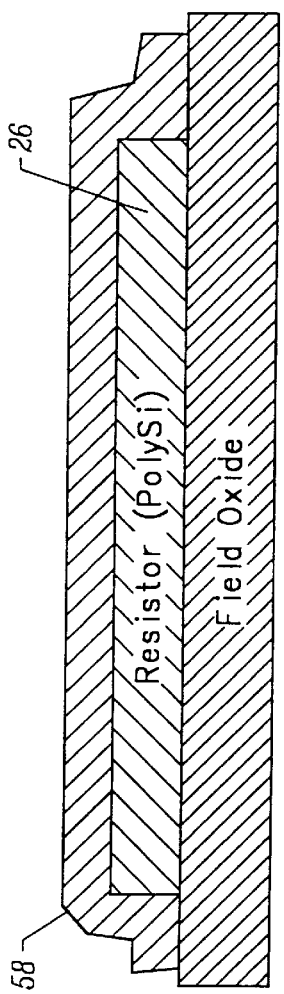
FIGS. 7A–7C illustrate steps in a high temperature process flow for fabricating the ballast in accordance with yet another embodiment of the invention.
Figure 7B:
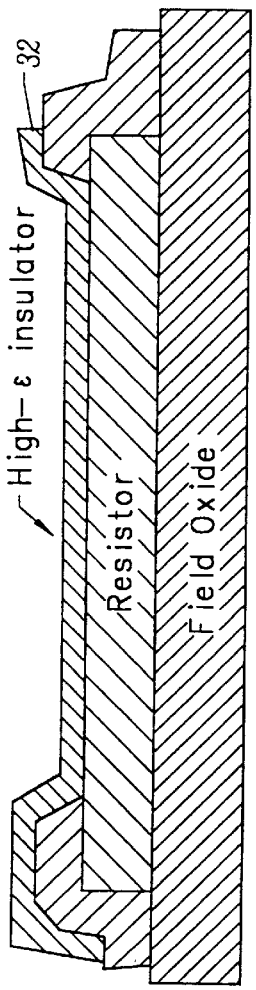
Figure 7C:
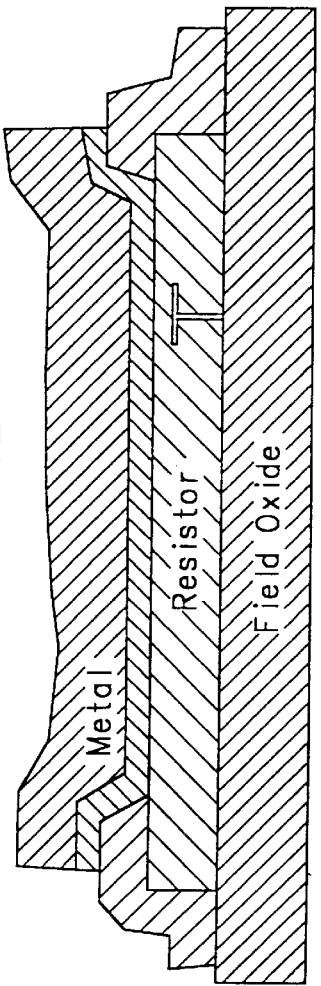

FIGS. 7A–7C illustrate steps in another high temperature process in building the structure of FIG. 4. After forming the active devices and the polysilicon resistor 26, a passivation layer 58 is formed over the polysilicon structure. As shown in FIG. 7B, the passivation layer is etched from the top of the resistor 26 and the high dielectric film 32 is deposited after in situ etching of any native oxide from the polysilicon resistor. This structure is then annealed at 500°–700° C. for one minute and then patterned and etched from the contact areas. Thereafter, as shown in FIG. 7C, the metal interconnect is deposited and patterned followed by final passivation, anneal and alloy.

The integrated resistor-capacitor ballasting structure for a high frequency power bipolar transistor provides increased gain and improves stability in operating the bipolar transistor.

While the invention has been described with reference to specific embodiments, the description is illustrated with the invention and is not to be construed as limiting the invention. Various modifications and applications may occur to those skilled in the art without departing from the true spirit and scope of the invention as defined by the appended claims.

What is claimed is:

1. In an integrated RF bipolar transistor formed in a semiconductor body and having a ballast comprising a parallel resistor-capacitor connected to an emitter of the transistor, a method of fabricating the ballast on the semiconductor body comprising the steps of:

a) forming a resistive layer on a surface of said semiconductor body, said resistive layer contacting the emitter of the transistor at an emitter contact, b) depositing a first metal layer on the surface and laterally spaced from the resistive layer, the first metal layer including an extension contacting the resistive layer at a point spaced from the emitter contact, whereby the first metal layer does not overlay the resistive layer except for the extension, c) defining a capacitive plate area on said first metal layer on which oxides have been removed, d) depositing a dielectric material over said capacitive plate area, and e) depositing a second metal layer over said dielectric material and over the first metal layer, the second metal layer functioning as a capacitor plate, said second metal layer having an extension contacting said emitter contact.

2. The method as defined by claim 1, wherein step a) forms a polycrystalline silicon layer, and steps b) and e) deposit aluminum metal.

3. The method as defined by claim 1, wherein step b) deposits metals from the group consisting of a refractory metal and a refractory metal silicide.

4. The method as defined by claim 1, wherein step c) comprises in situ etching of oxides on the capacitive plate area.

5. The method as defined by claim 1, wherein step c) comprises depositing a native oxide free material on the capacitive plate area.

6. The method as defined by claim 5, wherein the native oxide free material is selected from the group consisting of platinum, platinum silicide and gold.

* * * * *